(12) United States Patent
Schaefer

(10) Patent No.: US 7,355,399 B2
(45) Date of Patent: *Apr. 8, 2008

(54) NON-CONTACT SENSOR SYSTEM

(75) Inventor: Rolf Schaefer, Walluf (DE)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 11/685,078

(22) Filed: Mar. 12, 2007

(65) Prior Publication Data

US 2007/0152665 A1 Jul. 5, 2007

Related U.S. Application Data

(63) Continuation of application No. 10/982,221, filed on Nov. 5, 2004, now Pat. No. 7,208,948.

(30) Foreign Application Priority Data

Dec. 22, 2003 (DE) .................. 03104869

(51) Int. Cl.
*G01R 33/12* (2006.01)

(52) U.S. Cl. ..................... 324/260; 324/212
(58) Field of Classification Search ............ 324/212, 324/260

See application file for complete search history.

(56) References Cited

U.S. PATENT DOCUMENTS 7,208,948 B2 * 4/2007 Schaefer ................ 324/260

* cited by examiner

*Primary Examiner*—Reena Aurora
(74) *Attorney, Agent, or Firm*—Zilka-Kotab, PC

(57) ABSTRACT

A non-contact sensor system according to one embodiment includes a substrate having a substantially planar surface with at least one sensor element mounted to the substrate, the at least one sensor element being directed by a guiding element towards at least one data track on a substantially planar medium positioned opposite the at least one sensor element, wherein the substantially planar surface of the substrate and the substantially planar surface of the medium each carry at least one magnetic track, wherein orientations of magnetizations of the magnetic tracks are such that the substrate experiences a force away from the medium.

20 Claims, 5 Drawing Sheets

NON-CONTACT SENSOR SYSTEM

RELATED APPLICATIONS

This application is a continuation of U.S. patent application Ser. No. 10/982,221 filed Nov. 5, 2004 now U.S. Pat. No. 7,208,948.

FIELD OF THE INVENTION

The present invention relates to a high-resolution sensor system, and more particularly, this invention relates to a high-resolution sensor system that works in non-contact mode.

BACKGROUND OF THE INVENTION

Devices for quantative detection of linear and rotary movements are known. Optical encoders are used to detect the rotation angle or, respectively, a length and a direction of a rotary movement or, respectively, linear movement of moving bodies. The essential components of such a device are the emitter system, a grid plate, normally a grid disk or a grid straight edge, and the detector system. The emitter system normally contains a light emitting diode (LED). The light beam emitted from the light emitting diode or laser diode is modulated by the grid plate. The grid plate is connected to a moving body and has a periodic opening pattern. The detector system detects the transmitter signal (modulated by the grid plate) from the laser diode and, at the output, supplies information relating to the light beam and the direction of movement.

High-resolution magnetic encoders using Hall sensors are also known. As well, magnetic encoders (magneto-electric converters) which employ a magnetoresistance effect element made of a thin ferromagnetic film, have been commonly used in various fields due to their good durability in a surrounding atmosphere, wide operational temperature range and high response frequency. For example, magnetic encoders are used for controlling the rotational speed of a capstan motor in a video tape recorder or the like. Generally speaking, magnetic encoders are used for positional or speed control in factory automation (FA) equipments, such as servomotors, robots and the like, or in office automation (OA) equipments, such as computer-printers and copying machines. In recent years, there has been an increasing demand for improving the accuracy of such equipments. In general, the magnetic encoder includes a magnetic recorder and a magnetic sensor disposed in opposition to the magnetic recorder. The magnetic recorder comprises a non-magnetic substrate and a recording medium which is a permanent magnetic material coated on the peripheral or flat surface of the non-magnetic substrate. The recording medium is magnetized in a multipolar fashion at a magnetizing pitch λ to form at least one magnetic signal track.

A hard disk drive (HDD) is a digital data storage device that writes and reads data via magnetization changes of magnetic storage disk along concentric information tracks. During operation of the HDD, the disk is rotated at speeds in the order of several thousand revolutions-per-minute (RPM) while digital information is written to or read from its surface by one or more magnetic transducers. To perform an access request, the HDD first positions the sensor and/or write head, also referred to as a "read/write head", at the center of the specified data track of the rotating disk.

During operation of the HDD, the read/write head generally rides above the disk surface on a cushion of air, caused by an "air bearing surface" that is created by the movement of the disk under the head. The distance between the read/write head and the disk surface while riding, or partially riding, on the air cushion is referred to as the "flying height" of the head.

Further, the head is carried by a "slider" which is supported by hydrodynamic lift and sink forces. These lift forces are given by the interaction of air streaming underneath the surface structure of the slider.

To build encoder applications with high resolution, it is important to minimize the gap between the sensor and the information track.

As the air bearing surface varies with the rotation speed, using air pressure as with the HDD applications is not possible if the variation of the relative movement is too high.

The known optical encoders are limited to a small temperature range due to high sensitivity of the used sensor/encoder-optics to temperature changes. The resolution of these encoders is also very sensitive to dust and humidity of the environment.

Hall sensors are very sensitive to temperature changes and thus can also not be used in a wide temperature range as required in the field of automotive applications, industrial applications or the like.

What is therefore needed is a high-resolution magnetic encoder system that overcomes the disadvantages of the prior art systems.

SUMMARY OF THE INVENTION

A non-contact sensor system according to one embodiment includes a substrate having a substantially planar surface with at least one sensor element mounted to the substrate, the at least one sensor element being directed by a guiding element towards at least one data track on a substantially planar medium positioned opposite the at least one sensor element, wherein the substantially planar surface of the substrate and the substantially planar surface of the medium each carry at least one magnetic track, wherein orientations of magnetizations of the magnetic tracks are such that the substrate experiences a force away from the medium A non-contact sensor system according to another embodiment includes a substrate; a medium spaced from the substrate and having a data track thereon; a sensor element mounted to the substrate; a first magnetic track positioned on or coupled to the substrate; a second magnetic track positioned on or coupled to the magnetic medium; wherein orientations of magnetizations of the magnetic tracks are such that the substrate experiences a vertical force away from the medium.

A non-contact sensor system according to yet another embodiment includes a first substrate; an optical sensor element mounted to the first substrate; a second substrate spaced from the first substrate and having an optically visible marker theron; a guiding element biasing the first substrate towards the second substrate; a first magnetic track positioned on the first substrate; a second magnetic track positioned on the second substrate; wherein orientations of the magnetizations of the magnetic tracks are such that the first substrate experiences a vertical force away from the second substrate.

Other aspects and advantages of the present invention will become apparent from the following detailed description, which, when taken in conjunction with the drawings, illustrate by way of example the principles of the invention.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

BEST MODE FOR CARRYING OUT THE INVENTION

Figure 1:
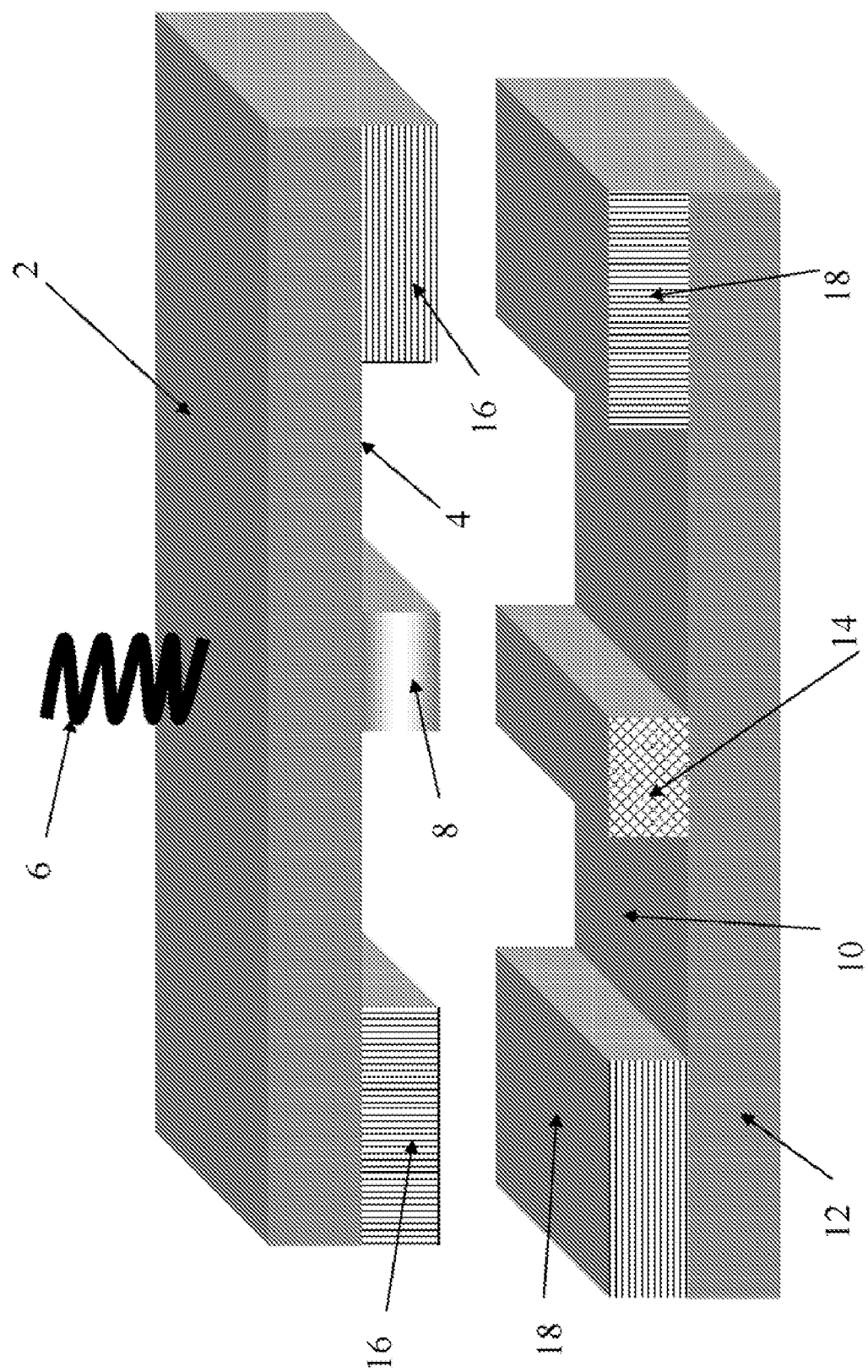
FIG. 1 schematically depicts an embodiment of the inventive system.

The following description is the best embodiment presently contemplated for carrying out the present invention. This description is made for the purpose of illustrating the general principles of the present invention and is not meant to limit the inventive concepts claimed herein.

The inventive magnetic sensor system can be used, for example, as a read/write encoder for the detection of a length, velocity, and direction of a rotary movement or, respectively, linear movement of moving bodies. It can also be applied in all cases, where a small distance is required in order to measure properties of a material with high resolution, or it can be used as a tool, or as a combined system, i.e., a tool and a sensor. If the present invention issued as a tool, the sensor (8 in FIG. 1) can be replace by an actuator, e.g., an electrical coil, to produce heat. Since the coil can be very small (having a diameter of about 1 µm, or below), and the tool-suface distance is very small as well (also below about 10 µm, preferably below about 1 µm), the surface can be molded at dedicated locations.

In the following description, the application of the invention as a magnetic encoder will be described. In this embodiment, the sensor element may be a GMR (Giant Magneto-Resistive) or a TMR (Tunneling Magneto-Resistive) sensor of the type standard in the HDD art. The sensor has no contact with the magnetic media and the whole system may be encapsulated. Also, it should be kept in mind that the sensor described below can be found in a standard read/write head of a type known in the art. Further, the sensor can be replaced with an optical emitter/sensor or Hall sensor with appropriate opposing surfaces.

A preferred embodiment implements a magnetic system with a rotating magnetic substrate such as, e.g., a magnetic disk, and minimizes the gap between the sensor and a data or information track on the disk by means of magnetic forces that are independent of any relative movement between the sensor and the disk.

One especially advantageous configuration of the inventive non-contact, high-resolution magnetic sensor system is similar to current HDD slider technology using air pressure (air bearing principle) for establishing a nearly constant distance between the magnetic sensor and the disk. However, the proposed solution differs from that technology in that the pressure of the air is replaced by the pressure/force of a magnetic field to control the distance between the disk surface and the slider (magnetic bearing principle).

Air pressure cannot be used if the relative movement between the sensor and the disk surface varies, as in present sensor applications where the magnetic disk together with the magnetic sensor used as magnetic encoder. Likewise, non hard-drive applications have an operation range where the air pressure method is not applicable. On the other hand, a magnetic force between the slider and the disk surface is independent of any relative movement between those components.

This invention replaces the air bearing effect with the force of a magnetic field to control the distance between the surface and the slider. The invention has the advantage that the magnetic force is independent of any relative movement, and therefore, this method can be applied to any surface independent of shape and movement between the slider and the surface in order to create a non-contact high-resolution system.

As shown schematically in FIG. 1, a slider 2 having a substantially planar surface 4 is mounted on a suspension 6 as a guiding element. The slider carries a sensor element 8, e.g., a magnetic, electrical or force sensor or an actuator, e.g., a coil to apply a magnetic field, a heating element or the like. The suspension 6, that can include a spring, pneumatic/hydraulic pressure element, a magnet or the like, biases the slider 2 against a surface 10 of a magnetic medium 12, such as, e.g., a magnetic disk. Mounted on or formed in the magnetic disk 12 is a data track 14 that is arranged opposite the sensor 8. The slider 2 and the magnetic disk 12 both include at least one magnetic levitation track 16, 18, which can be either permanent or electromagnetic. The orientation of the magnetization of the levitation tracks 16, 18 are designed such that the slider 2 receives a vertical force (relative to the plane of the disk 12) away from the magnetic disk 12. This force counteracts the biasing of the suspension 6 to create a dedicated distance between the slider 2 and magnetic disk 12. The slider 2 is thus flying on a detracting (opposing) force created by the magnets 16, 18. The distance between the slider 2 and the magnetic disk 12 depends on the magnetic force and the suspension force. The magnetization also applies a horizontal force to the slider if the slider is not on its track. This force keeps the slider aligned with the proper track.

Figure 2:
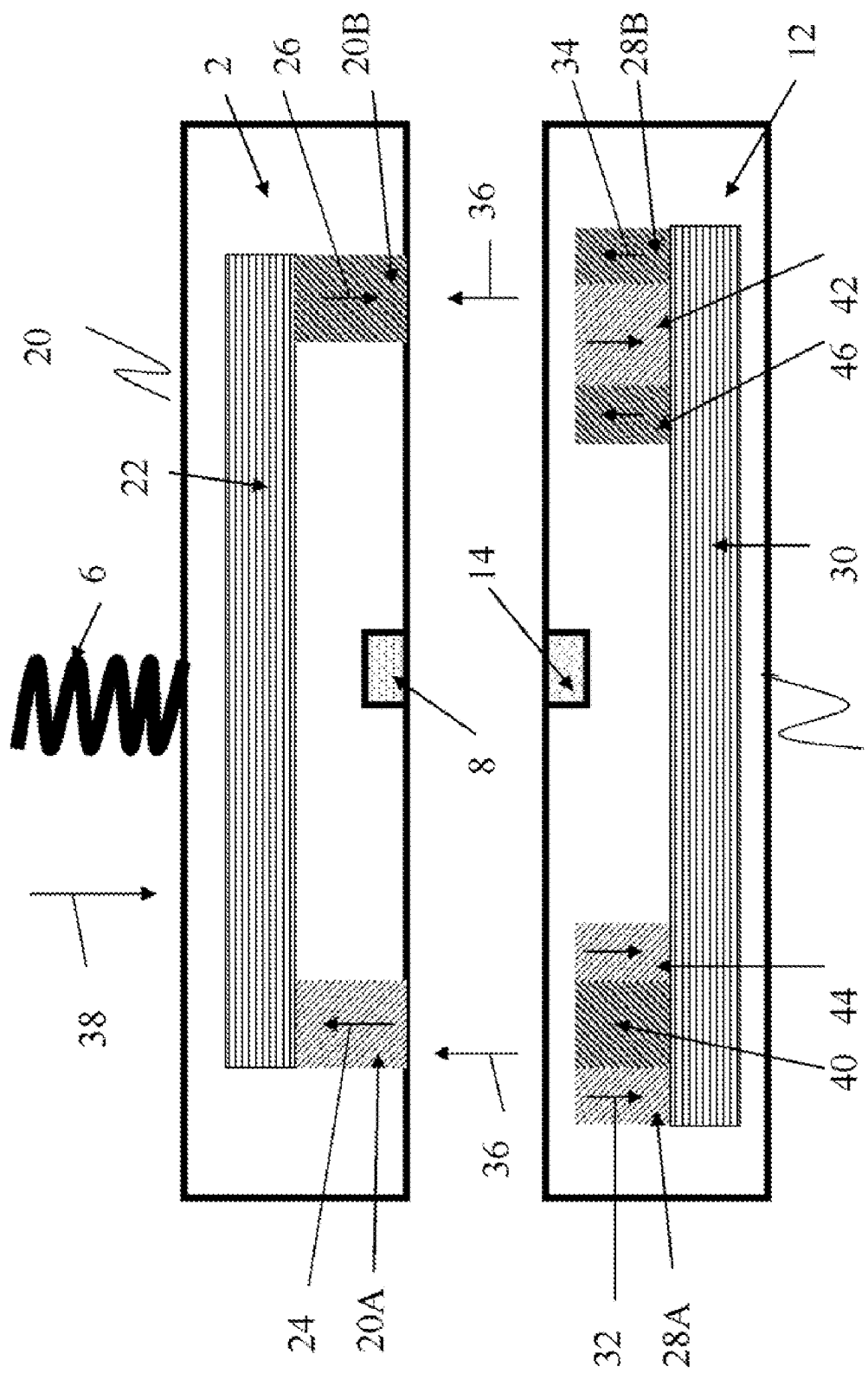
FIG. 2 is a cross sectional view schematically showing the arrangement of the magnets in the components of the inventive system.

FIG. 2 is a cross sectional view schematically showing the arrangement of the magnets in the components of the inventive system. The slider 2, carrying the sensor element 8 has a slider magnet 20, the south pole 20A and the north pole 20B of which are connected by yoke 22. The direction of the magnetic force is indicated by arrows 24, 26. The magnetic disk 12 includes the data track 14. A strong magnet 28 is coupled to the disk. The south pole 28A and the north pole 28B of the strong magnet 28 are connected by yoke 30. The strong magnet 28 creates the detracting force needed to create the distance between slider 2 and disk 12. The direction of the magnetic force is indicated by arrows 32, 34. The vertical force (arrow 36) between the slider magnet 20 and the magnet 28 of the magnetic disk 12 counteract the force of the suspension 6 (cf. arrow 38) to create a dedicated distance therebetween.

Also shown in FIG. 2 are weak magnets 40, 42 and strong magnets 44, 46 on the surface of the magnetic disk 12. The weak magnets create the forces that keep the slider 2 aligned with the data track 14. The combination of these magnets, which applies an attractive and detractive force to the slider 2, creates a horizontal force to avoid displacement of the slider 2 from its track. If this functionality is not needed, the magnetic components 40, 42, 44 and 46 may be removed.

Inside the slider 2 and the magnetic disk 12, the magnetic force is guided by the yokes 22 and 30. Shields in the sensor element and the data track to shield the magnetic fields of the yokes 22, 30 are not shown in FIG. 2.

It is also possible to exchange the magnetic structure in the slider 2 with the magnetic structure in the magnetic disk 12. In other words, the stack in the magnetic disk 12 can be placed in the slider while the magnet in the slider is placed in the magnetic disk. To improve the flying and tracking performance more complicated magnetic stack designs may be used.

The detracting force created by the levitation magnets 28A, 28B, 40, 44, 42, 46 can be calculated from the total magnetic energy by using the method of virtual displacement. Where the gap between the slider and the magnetic disk is smaller than the lateral dimension of the magnets, the magnetic energy density is equal to $0.5 * H * B$, with H the magnetic field strength and B the magnetic induction. From this, the magnetic pressure (p) can be calculated from the volume between the levitation magnets, the surface area of, and the distance between the levitation magnets as being $p=4 * B^2$, with B measured in tesla and p measured in bar. This means that, e.g., to get a pressure of 1 bar a magnetic induction of 0.5 Tesla is needed.

Figure 3:
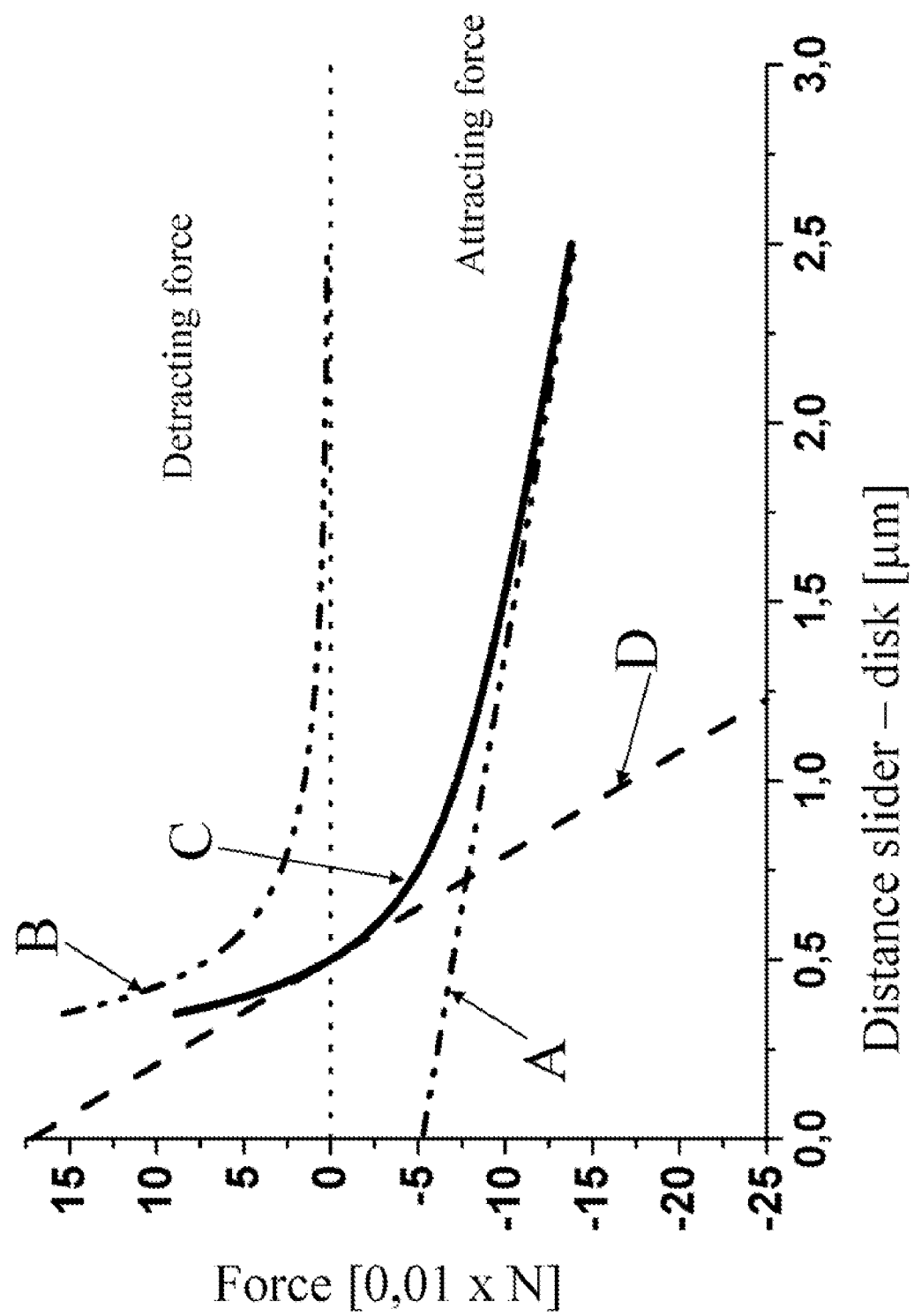
FIG. 3 is a chart of force vs. the gap height in the inventive system.

FIG. 3 is a graph showing the force vs. the gap height, i.e., the distance between the slider 2 and the magnetic disk 12. FIG. 3 illustrates, by way of example, the principle of the inventive system, especially, how the different sources of force (spring/magnet) work together. The suspension creates a force towards the disk surface (attracting force-curve A). The magnets create a force in the opposite direction (detracting force-curve B). The resulting force (curve C) is zero at a distance of 0.5 μm. At this point the effective spring constant (curve D) is 10 times higher than the spring constant of the suspension (cf. curve A). That means that the resonance frequency of the whole system, i.e., the slider-suspension system, is 3 times higher than the resonance frequency of the suspension. This, in turn, means that the system is very robust against vibrations or shocks.

Figures 4A, 4B:
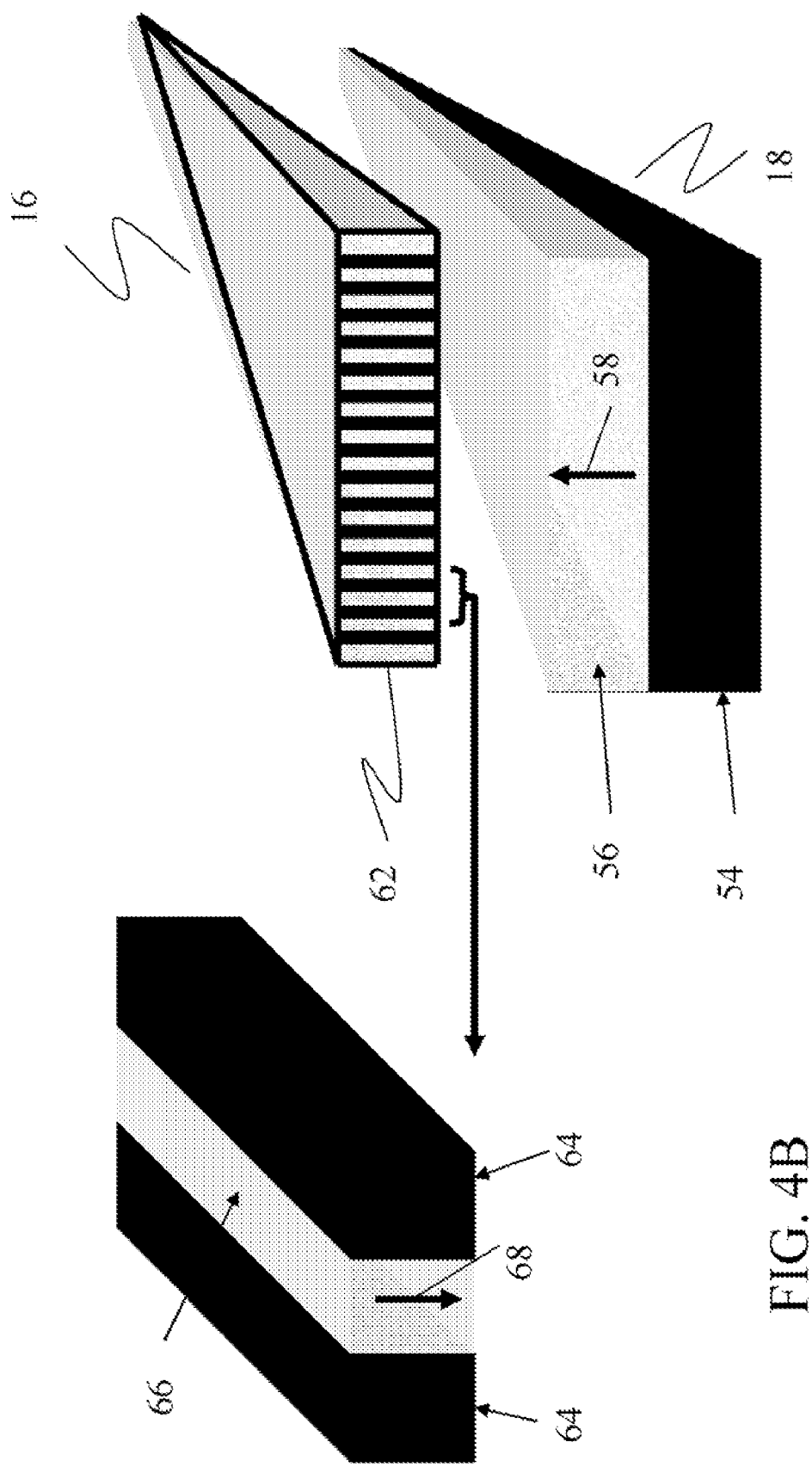
FIGS. 4A and 4B depict a design of the levitation magnets of FIG. 1.

FIGS. 4A and 4B show one design of the levitation magnets 16, 18 of FIG. 1. The disk substrate 54, being made of non magnetic material, is covered by a magnetic material 56, forming one disk levitation magnet 18. The arrow 58 indicates the magnetic orientation. Flying above the covered disk substrate is a slider levitation magnet 16. In the embodiment shown, the slider levitation magnet is formed by a multilayer structure 62, but can be formed of a single layer as well. FIG. 4B shows a magnification of the slider levitation multilayer structure 62, being formed by a sequence of non magnetic layers 64 and magnetic layers 66. The arrow 68 indicates the magnetic orientation.

Figure 5:
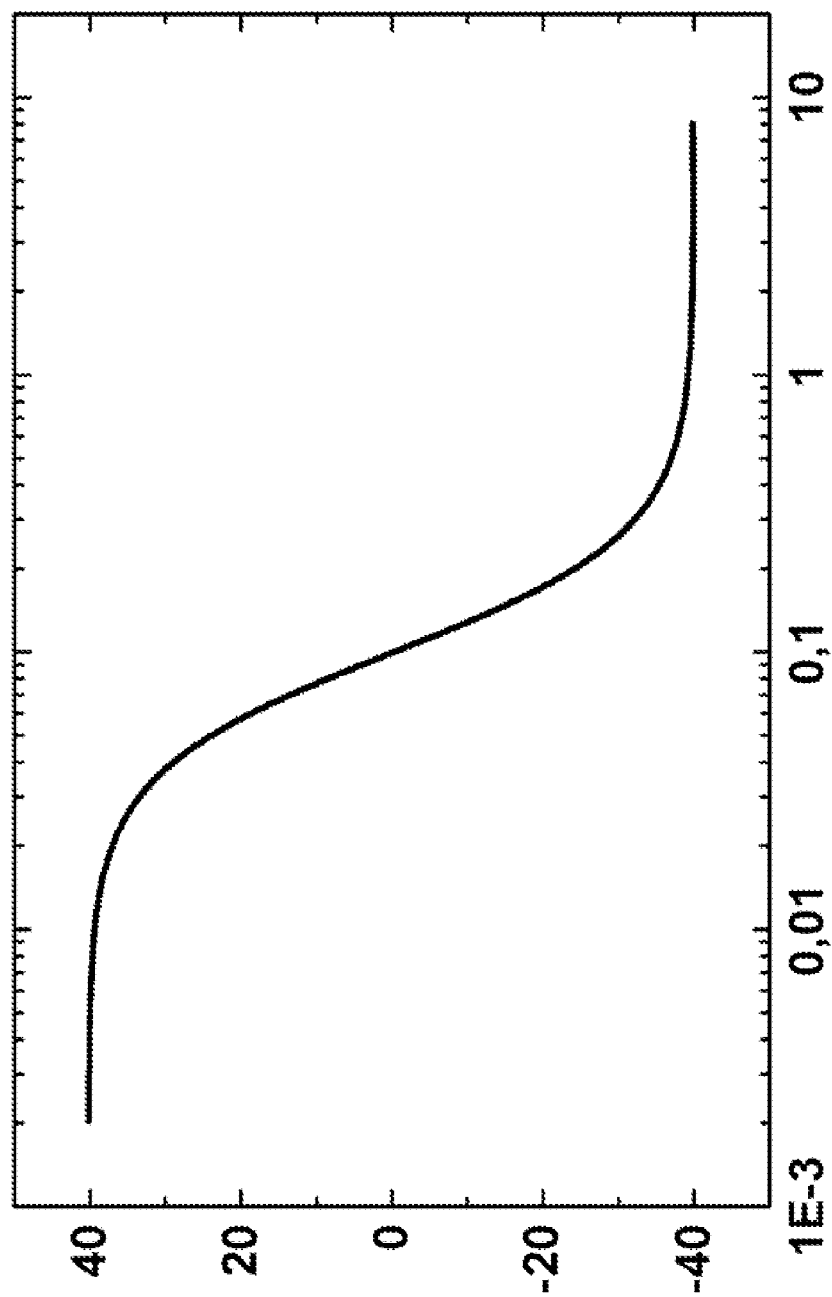
FIG. 5 depicts a chart representing the forces for the design in FIG. 4.

FIG. 5 is a graph showing an illustrative calculation of the forces acting on the slider 2 as a function of the flight height, using the design of FIG. 4.

In use, the magnetic medium 12 is coupled to an external device (not shown), e.g., a motor, spindle, gear, or the like, the rotation of which is to be evaluated. The magnetic medium 12 can be generally planar (as described), or can be formed along the outside of a generally cylindrical-shaped substrate. As the magnetic medium 12 rotates with the external device, data written in the data track 14 causes a measurable change in an electrical current passing through the sensor 8, which can be used to calculate rotational velocity. Where the position of the data on the track 14 relative to the magnetic medium 12 is known, positional as well as velocity data is determinable. And because of the high data density per track 14 that can be read with GMR and TMR sensors, very precise positional and rotational information can be obtained.

A variation on the above would implement an optical sensor which reads optically recognizable markers on a surface replacing the magnetic disk.

Another variation would have the sensor 8 move with relation to a stationary medium 12. Movement of the slider 2 to which the sensor 8 is attached may be difficult due to the evaluation unit and the respective leads attached to the slider 2. However, in case the respective connections are realized without actual physical leads e.g., wireless, or with brushes and contact tracks, this can be done very easily.

Illustrative devices that can implement the system include magnetic storage systems, FA equipment, OA equipment, etc.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A non-contract sensor system, comprising:
a substrate having a substantially planar surface with at least one sensor element mounted to the substrate, the at least one sensor element being directed by a guiding element towards at least one data track on a substantially planar medium positioned opposite the at least one sensor element, wherein the substantially planar surface of the substrate and the substantially planar surface of the medium each carry at least one magnetic track, wherein orientations of magnetizations of the magnetic tracks are such that the substrate experiences a force away from the medium.

2. The sensor system according to claim 1, wherein the at least one sensor element is selected from the group consisting of a magnetic sensor, an electrical sensor, a force sensor, and a Hall sensor.

3. The sensor system according to claim 1, wherein the at least one sensor element is a GMR sensor or a TMR sensor.

4. The sensor system according to claim 1, wherein the at least one sensor element is part of a read/write head.

5. The sensor system according to claim 1, wherein the substrate is a slider.

6. The sensor system according to claim 1, wherein the guiding element is a suspension.

7. The sensor system according to claim 1, wherein the guiding element includes at least one of a spring, a magnet, and a pneumatic/hydraulic pressure element for biasing the substrate towards the medium.

8. The sensor system according to claim 1, wherein the medium is a magnetic disk.

9. The sensor system according to claim 1, wherein the at least one magnetic track include at least two levitation magnets.

10. The sensor system according to claim 9, wherein at least one of the magnetic tracks further includes a pair of magnets flanking the levitation magnet of the magnetic track, the pair of magnets creating a force for helping maintain an alignment of the at least one sensor element with the at least one data track.

11. The sensor system according to claim 9, wherein at least one of the levitation magnets is a laminate of magnetic and non magnetic layers.

12. The sensor system according to claim 1, wherein the substrate and the medium are able to perform a relative movement.

13. The sensor system according to claim 1, wherein the sensor element is an optical sensor.

14. The sensor system according to claim 1, wherein the at least one sensor element is, in the alternative, at least one tool adapted to modify a surface of the medium.

15. A non-contact sensor system, comprising:
a substrate;
a medium spaced from the substrate and having a data track thereon;
a sensor element mounted to the substrate;
a first magnetic track positioned on or coupled to the substrate;
a second magnetic track positioned on or coupled to the magnetic medium;
wherein orientations of magnetizations of the magnetic tracks are such that the substrate experiences a vertical force away from the medium.

16. The sensor system according to claim 15, wherein the sensor element is selected from the group consisting of a magnetic sensor, an electrical sensor, a force sensor, and a Hall sensor.

17. The sensor system according to claim 15, wherein the sensor element is part of a read/write head.

18. The sensor according to claim 15, wherein the sensor element is an optical sensor.

19. The sensor according to claim 15, wherein the at least one sensor element is in the alternative, at least one tool adapted to modify a surface of the magnetic medium.

20. A non-contact sensor system, comprising:
a first substrate;
an optical sensor element mounted to the first substrate;
a second substrate spaced from the first substrate and having an optically visible marker thereon;
a guiding element biasing the first substrate towards the second substrate;
a first magnetic track positioned on the first substrate;
a second magnetic track positioned on the second substrate;
wherein orientations of the magnetizations of the magnetic tracks are such that the first substrate experiences a vertical force away from the second substrate.

* * * * *